United States Patent
Chan et al.

(10) Patent No.: US 8,166,638 B2
(45) Date of Patent: May 1, 2012

(54) ROTARY CLIP BONDER

(75) Inventors: Wai Lik Chan, Kwai Chung (HK); Man Chung Ng, Kwai Chung (HK); Ching Yuen To, Kwai Chung (HK)

(73) Assignee: ASM Assembly Automation Ltd, Hong Kong (HK)

( * ) Notice: Subject to any disclaimer, the term of this patent is extended or adjusted under 35 U.S.C. 154(b) by 0 days.

(21) Appl. No.: 12/796,789

(22) Filed: Jun. 9, 2010

(65) Prior Publication Data

US 2010/0313415 A1   Dec. 16, 2010

Related U.S. Application Data

(60) Provisional application No. 61/186,125, filed on Jun. 11, 2009.

(51) Int. Cl.
*B23P 19/00* (2006.01)

(52) U.S. Cl. .............. 29/747; 29/757; 29/758; 29/759; 29/760

(58) Field of Classification Search .............. 29/747, 29/757, 758, 759, 760; 294/87.1
See application file for complete search history.

(56) References Cited

U.S. PATENT DOCUMENTS

| | | | | |
|---|---|---|---|---|
| 4,832,180 | A * | 5/1989 | Ferrero | 198/468.3 |
| 6,439,621 | B1 * | 8/2002 | Altmann et al. | 285/381.4 |
| 7,234,744 | B2 * | 6/2007 | Osten et al. | 294/65 |
| 7,360,645 | B2 * | 4/2008 | Pogu et al. | 198/861.1 |
| 2003/0235491 | A1 * | 12/2003 | Subotincic | 414/627 |

* cited by examiner

*Primary Examiner* — Carl Arbes
(74) *Attorney, Agent, or Firm* — Ostrolenk Faber LLP

(57) ABSTRACT

Multiple connector clips are bondable onto an electronic device simultaneously with a rotary clip bonder, wherein a pick head comprising a plurality of collets is positioned at a clip supply channel. A plurality of connector clips are picked up from the clip supply channel in a fixed orientation with the pick head and are conveyed to a clip bonding area where the electronic device is located. The pick head is rotated with a rotary motor about a rotational axis passing through a shaft connecting the rotary motor to the pick head in order to change the orientation of the plurality of connector clips, before the connector clips are bonded at the clip bonding area.

8 Claims, 5 Drawing Sheets

ROTARY CLIP BONDER

CROSS REFERENCE TO RELATED APPLICATION

This application claims the benefit and priority of U.S. Provisional Application Ser. No. 61/186,125 filed on Jun. 11, 2009, and entitled ROTARY CLIP BONDER, the disclosure of which is incorporated herein by reference.

FIELD OF THE INVENTION

The invention relates to bonding machines for semiconductor devices, and in particular, to bonding machines for attaching connector clips onto devices during the assembly and packaging of semiconductor packages.

BACKGROUND AND PRIOR ART

In semiconductor devices that integrate a power transistor and a control integrated circuit onto a single semiconductor chip, a connector clip instead of a wire is used to electrically connect a bonding pad in a power transistor formation region with an external terminal or lead. The connector clip has a larger cross-section than that of a wire, and can decrease the power transistor's on-resistance and therefore its power consumption. It is also possible to decrease the wiring resistance for the chip and suppress bonding damage.

Typically, a pick head for the clip bonder machine bonds one connector clip at a time onto a substrate. However, it may sometimes be necessary to bond several connector clips simultaneously to increase throughput when the connector clips are to be bonded in certain fixed relative positions onto each substrate. In that case, the pick head will include a plurality of vacuum collets for picking up multiple connector clips at the same time.

Where the reel feeding orientation is the same as the orientation of the substrate for bonding, the transfer is relatively straightforward as the pick-and-place operation only involves moving the connector clips in a linear motion from a pick-up area to a placement or bonding area. FIG. 1 is a plan view of a conventional clip bonding operation of a clip bonder pick head from a clip supply channel 100 to a bonding area 106 wherein the connector clips 102 are picked up and bonded in the same orientation. The clip bonder pick head picks up a plurality of connector clips 102 from the clip supply channel 100 and transfers them linearly 104 to the bonding area. The clip supply channel 100 may typically be in the form of a reel holding an array of connector clips 102 in a fixed orientation, a lead frame or other transportation means. The connector clips 102 are picked up in the fixed orientation and moved to the bonding area 106 in order to bond the connector clips 102 onto a substrate (not shown).

However, a machine that is designed for connector clips oriented for a fixed input direction may not be able to cater to connector clips introduced at the clip supply channel in a different orientation without substantial hardware changes to the pick head to cater to this different orientation. It would be advantageous to provide a clip bonder with a pick head that can pick up and bond connector clips which are fed to the clip supply channel in various orientations and/or which have to be bonded in different orientations without having to modify the clip bonder to cater to each different orientation.

SUMMARY OF THE INVENTION

It is thus an object of the invention to seek to provide a method and apparatus that is operable to pick up connector clips in one orientation and to bond them in a different orientation during clip bonding operations.

According to a first aspect of the invention, there is provided a method of bonding multiple connector clips onto an electronic device simultaneously, comprising the steps of: positioning a pick head comprising a plurality of collets at a clip supply channel; picking up a plurality of connector clips from the clip supply channel in a fixed orientation with the pick head and conveying the connector clips to a clip bonding area where the electronic device is located; rotating the pick head with a rotary motor about a rotational axis passing through a shaft connecting the rotary motor to the pick head to change the orientation of the plurality of connector clips; and bonding the connector clips at the clip bonding area.

According to a second aspect of the invention, there is provided a rotary clip bonder for bonding a plurality of connector clips simultaneously onto an electronic device, comprising: a pick head comprising a plurality of collets for picking a plurality of connector clips in a fixed orientation from a clip supply channel; a conveyor operative to convey the pick head between the clip supply channel and a clip bonding area where the electronic device is located; and a rotary motor having a rotational axis passing through a shaft connecting the rotary motor and the pick head, which is operative to rotate the pick head and to change the orientation of the plurality of connector clips held by the pick head.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

An example of an apparatus in accordance with the invention will now be described with reference to the accompanying drawings, in which.

DETAILED DESCRIPTION OF THE PREFERRED EMBODIMENT OF THE INVENTION

Figure 1:
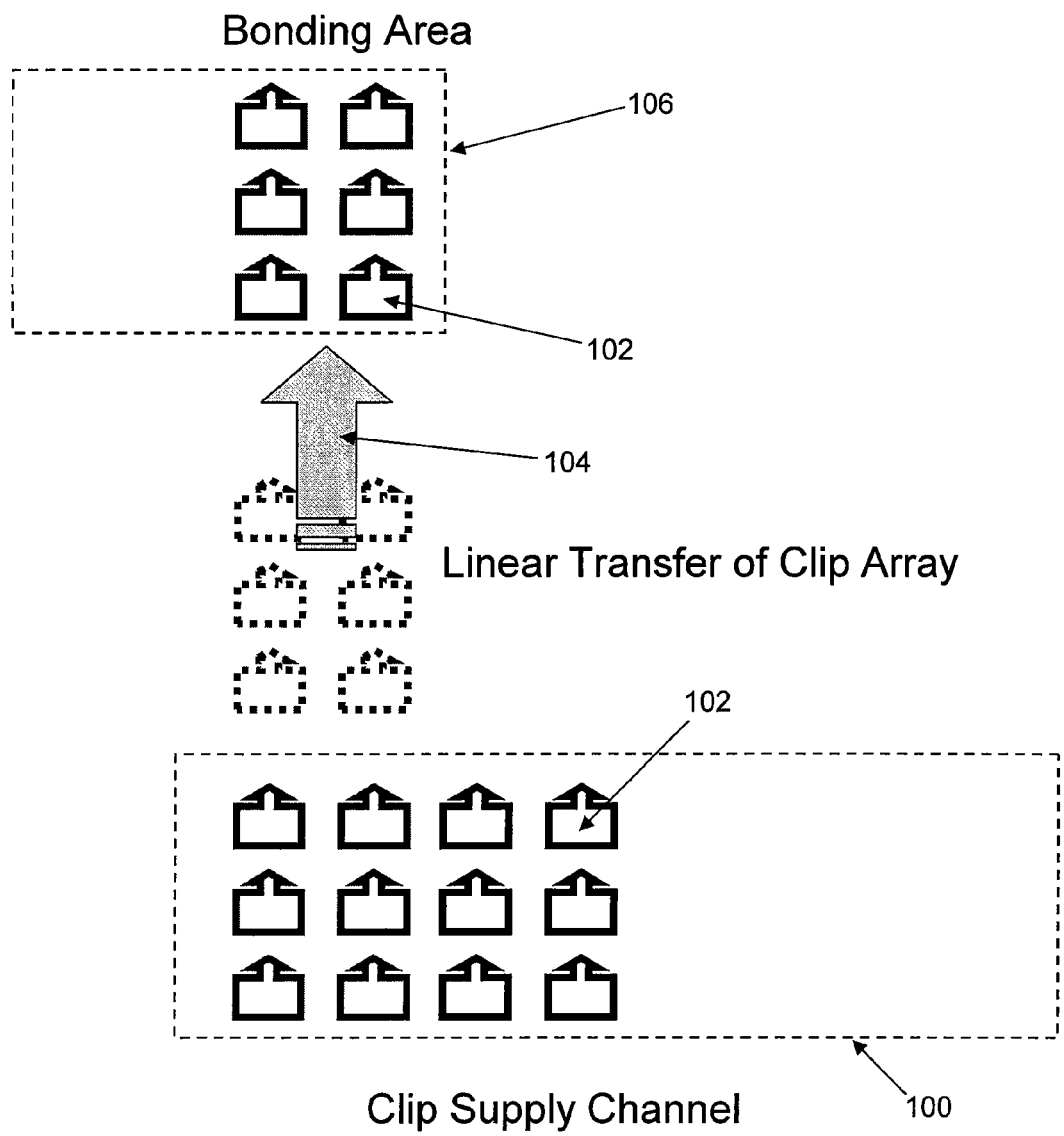
FIG. 1 is a plan view of a conventional clip bonding operation of a clip bonder pick head from a clip supply channel to a bonding area wherein the connector clips are picked up and bonded in the same orientation.
Figure 2:
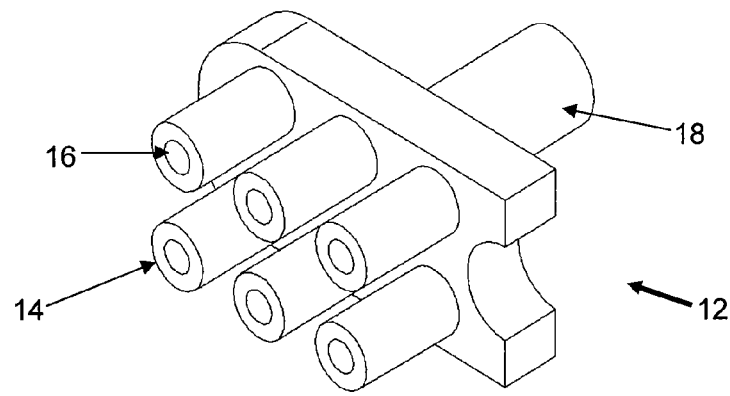
FIG. 2 is an isometric bottom view of a pick head of a clip bonder showing multiple suction collets for picking up multiple connector clips simultaneously.

FIG. 2 is an isometric bottom view of a pick head 12 of a clip bonder showing multiple suction collets 14 for picking up multiple connector clips simultaneously.

The suction collets 14 are arranged at fixed positions on the pick head 12 and have suction holes 16 at which vacuum suction is generated for holding each connector clip. The pick head 12 is supported by a shaft 18.

Figure 3:
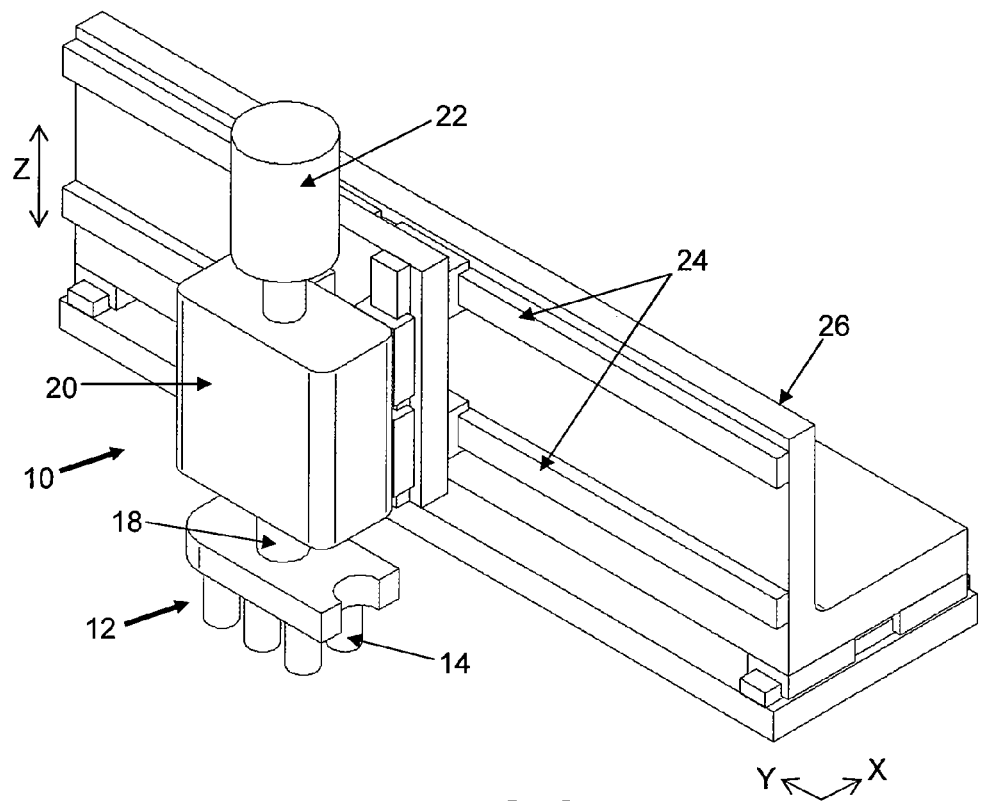
FIG. 3 is an isometric view of a clip bonder bond head according to the preferred embodiment of the invention.

FIG. 3 is an isometric view of a clip bonder bond head 10 according to the preferred embodiment of the invention. The pick head 12 is located at the bottom of the bond head 10 at one end of the shaft 18 and is connected to a conveyor 20 by means of the shaft 18. The shaft 18 is preferably passed through the conveyor 20 and is operatively connected to a rotary motor 22 located at the top of the conveyor 20 at an opposite end of the shaft 18. The rotary motor 22 is operative to rotate the shaft 18, which in turn rotates the pick head 12 which is fixedly attached to the shaft 18 on a horizontal plane when a change to an orientation of the connector clips 102 is required.

The conveyor 20 is guided by a guide rail or guide rails 24 to move linearly in a horizontal or Y direction along the guide rails 24. The guide rails 24 are arranged horizontally on a mounting bracket 26 such that the clip bonder bond head 10 is supported on the mounting bracket 26 to move the conveyor 20 and the pick head 12 between the clip supply channel 100 and the bonding area 106. The mounting bracket 26 is in turn movable vertically in Z directions in order to lower the pick head 12 to pick up or to bond the connector clips 102, and to raise the pick head 12 when the bond head 10 is moving between the clip supply channel 100 and the bonding area 106 along the guide rails 24. Hence, the mounting bracket 26 and pick head 12 are lowered together to bond the connector clips 102 onto the electronic device.

Figure 4:
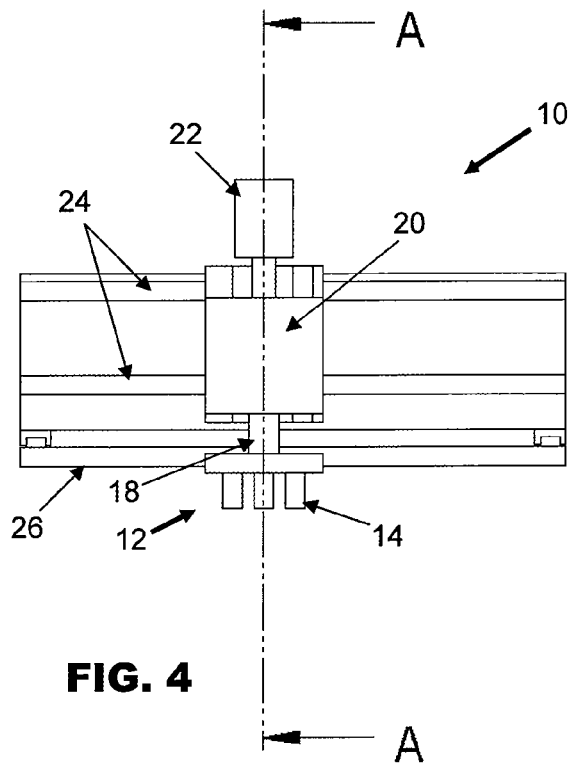
FIG. 4 is a front view of the clip bonder bond head illustrated in FIG. 3.
Figure 5:
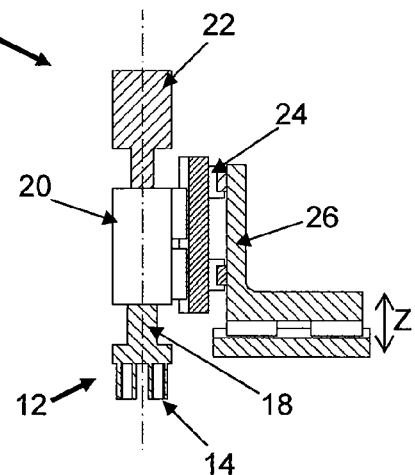
FIG. 5 is a cross-sectional side view of the clip bonder bond head looking along line A-A of FIG. 4.

FIG. 4 is a front view of the clip bonder bond head 10 illustrated in FIG. 3. The clip bonder bond head 10 is movable along the guide rails 24 in the Y directions. FIG. 5 is a cross-sectional side view of the clip bonder bond head 10 looking along line A-A of FIG. 4. This illustrates the movement of the mounting bracket 26 vertically in the Z directions.

Figure 6:
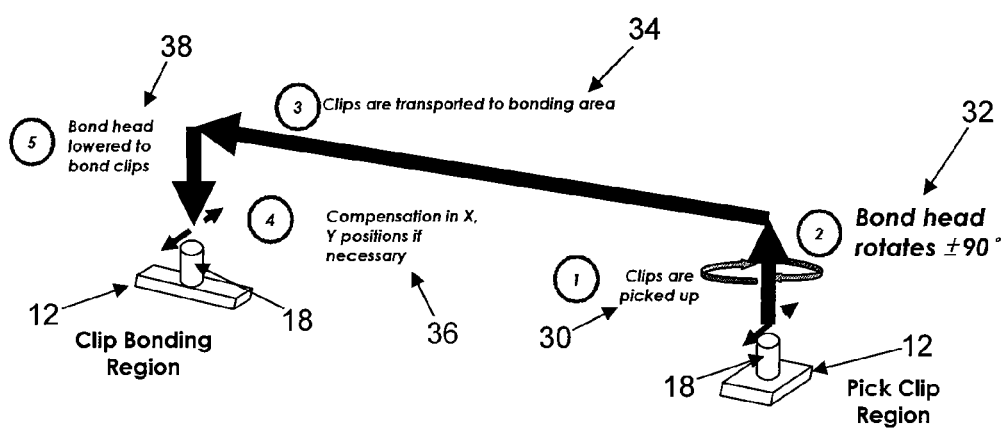
FIG. 6 illustrates a bond head pick-up and bond motion where an orientation of the connector clips is changed before the connector clips are bonded at a bonding area.

FIG. 6 illustrates a bond head pick-up and bond motion where an orientation of the connector clips 102 is changed before the connector clips 102 are bonded at a bonding area 106. First, at the clip supply channel, the connector clips are picked up by the pick head 30. An electronic device such as a lead frame may be located at the bonding area onto which the connector clips 102 are bondable. Thereafter, if the connector clips have to be oriented in a different direction during bonding, the connector clips may be rotated in any direction by any angle, such as 90° in either direction 32. The connector clips are then transferred to the bonding area 34. If necessary, the position of the bond head may be compensated along a horizontal plane in X and/or Y directions for greater accuracy 36. Once the bond head is correctly positioned, the bond head together with the pick head will be lowered and the connector clips are then bonded to a substrate at the bonding area 38.

Figure 7:
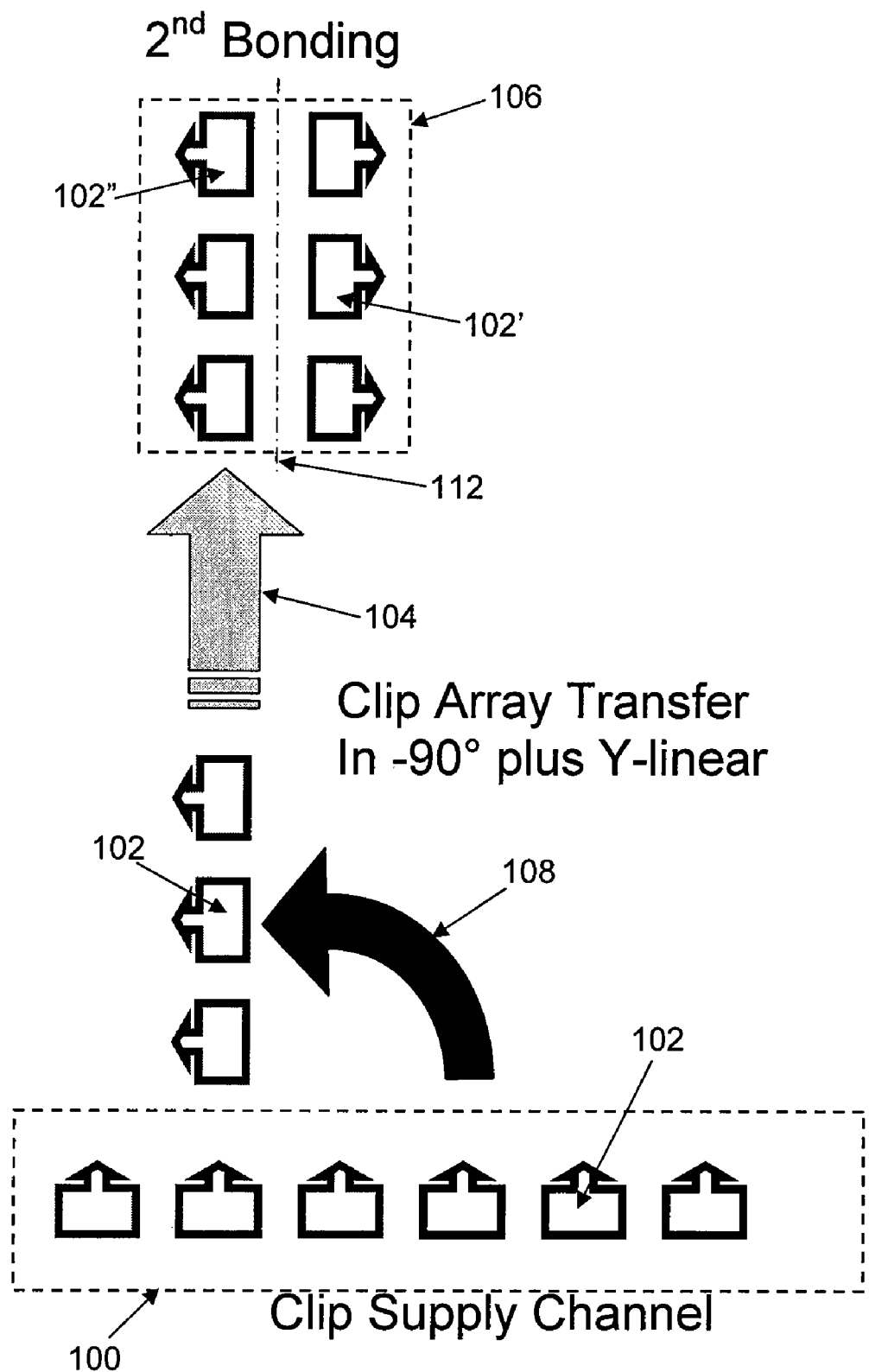
FIG. 7 illustrates a bonding operation where connector clips are bonded in rows in which each row of connector clips is a mirror image of an adjacent row of connector clips.

FIG. 7 illustrates a bonding operation where connector clips 102 are bonded in rows in which each row of connector clips 102' is a mirror image of an adjacent row of connector clips 102". Connector clips 102 are provided in a fixed orientation in the clip supply channel 100. The pick head 12 will pick up a plurality of connector clips 102, such as three connector clips 102, and rotate them by 90° in a first direction. A first row of connector clips 102' will be bonded onto the electronic device at the bonding area 106. Thereafter, another three connector clips 102 are picked up by the pick head 12 and are rotated by 90° in a second direction opposite to the first direction. A second row of connector clips 102" are bonded onto the electronic device at the bonding area 106. As shown in FIG. 7, the first row of connector clips 102' is a mirror image of the second row of connector clips 102" about a line 112 separating the first and second rows of connector clips 102', 102".

Figure 8:
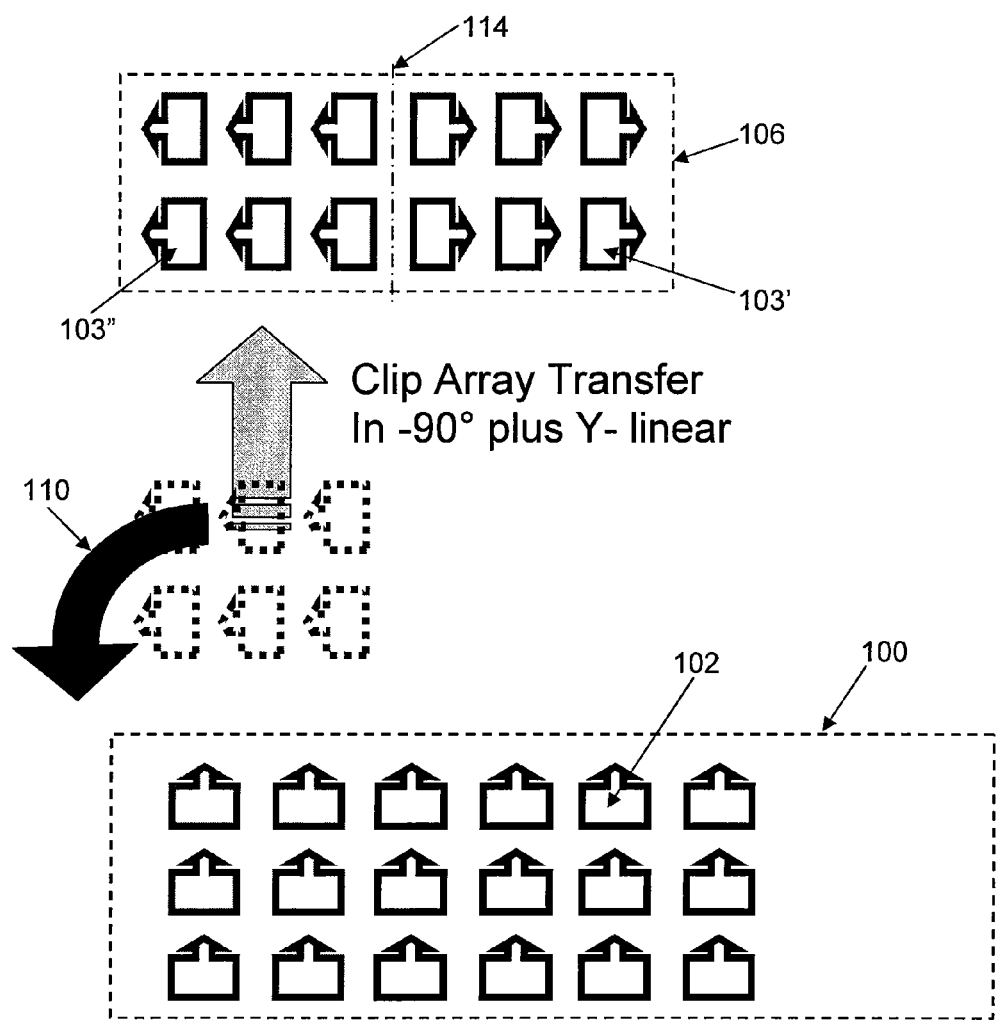
FIG. 8 illustrates a bonding operation where connector clips are bonded in rows in which multiple rows of connector clips are a mirror image of multiple rows of connector clips adjacent to them.

FIG. 8 illustrates a bonding operation where connector clips are bonded in rows in which multiple rows of connector clips 103' are a mirror image of multiple rows of connector clips 103" adjacent to them. Connector clips 102 are again provided in a fixed orientation in the clip supply channel 100. The pick head 12 will pick up a plurality of connector clips 102, such as six connector clips 102 at a time in multiple rows, and rotate them by 90° in a first direction. The multiple rows of connector clips 103' will be bonded at a first section of the bonding area 106. Thereafter, another six connector clips 102 comprising multiple rows are picked up by the pick head 12 and are rotated by 90° in a second direction opposite to the first direction. The second multiple rows of connector clips 103" are then bonded at a second section of the bonding area 106. As shown in FIG. 8, the multiple rows of connector clips 103' at the first section of the bonding area 106 is a mirror image of the multiple rows of connector clips 103" at the second section of the bonding area 106 about a line 114 separating the first and second sections.

The invention described herein is susceptible to variations, modifications and/or additions other than those specifically described and it is to be understood that the invention includes all such variations, modifications and/or additions which fall within the spirit and scope of the above description.

The invention claimed is:

1. A rotary clip bonder for bonding simultaneously multiple connector clips onto an electronic device, the rotary clip bonder comprising:
   a pick head comprising a plurality of collets positioned and configured to pick up a plurality of connector clips in a fixed orientation from a clip supply channel;
   a conveyor connected to the pick head, the conveyer being configured to convey the plurality of connector clips between the clip supply channel and a clip bonding area where the electronic device is located; and
   a rotary motor configured to rotate the pick head about a rotational axis to change the orientation of the plurality of connector clips held by the plurality of collets as the plurality of connector clips are conveyed by the conveyor between the clip supply channel and the clip bonding area,
   wherein the rotational axis passes through the rotary motor and the pick head.

2. The rotary clip bonder as claimed in claim 1, wherein the pick head and rotary motor are attached to opposite ends of a shaft, and the shaft passes through the conveyor.

3. The rotary clip bonder as claimed in claim 2, wherein the pick head is fixedly attached to the shaft, and the shaft is configured to rotate together with the pick head to change the orientation of the plurality of connector clips.

4. The rotary clip bonder as claimed in claim 1, further comprising:
   a mounting bracket; and
   a horizontal guide rail arranged on the mounting bracket,
   wherein the conveyor is positioned and configured to be moved along the guide rail to convey the plurality of connector clips between the clip supply channel and the clip bonding area.

5. The rotary clip bonder as claimed in claim 4, wherein the mounting bracket is operative to move vertically to raise and lower the pick head.

6. The rotary clip bonder as claimed in claim 5, further comprising a bond head,
   wherein the bond head and the pick head are configured to be lowered together to bond the connector clips onto the electronic device.

7. The rotary clip bonder as claimed in claim 1, wherein the rotary motor is configured to rotate the pick head about the rotational axis in opposite directions, the rotary motor being configured to rotate the pick head by one angle of a plurality of angles.

8. The rotary clip bonder as claimed in claim 7, wherein the one angle of a plurality of angles is 90 degrees.

* * * * *